(12) United States Patent
Yuan

(10) Patent No.: US 11,706,884 B2
(45) Date of Patent: Jul. 18, 2023

(54) ELECTRONIC DEVICE WITH RECEIVER ASSEMBLY

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventor: Bo-Duo Yuan, Shenzhen (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

(*) Notice: Subject to any disclaimer, the term of this patent is extended or adjusted under 35 U.S.C. 154(b) by 324 days.

(21) Appl. No.: 17/038,168

(22) Filed: Sep. 30, 2020

(65) Prior Publication Data
US 2021/0360804 A1    Nov. 18, 2021

(30) Foreign Application Priority Data
May 12, 2020  (CN) .......................... 202010396625.X

(51) Int. Cl.
*G06F 1/16* (2006.01)
*H05K 5/00* (2006.01)
*H04B 1/16* (2006.01)
*H04M 1/02* (2006.01)

(52) U.S. Cl.
CPC ............. *H05K 5/0091* (2013.01); *H04B 1/16* (2013.01); *H04M 1/0277* (2013.01)

(58) Field of Classification Search
CPC ....................................................... H05K 5/00
See application file for complete search history.

(56) References Cited

U.S. PATENT DOCUMENTS

2019/0237912 A1* 8/2019 Little ..................... H01R 43/24

* cited by examiner

Primary Examiner — Jerry Wu
(74) Attorney, Agent, or Firm — ScienBiziP, P.C.

(57) ABSTRACT

An electronic device includes a housing assembly and a receiver assembly. The housing assembly includes a first housing and a second housing. The first housing defines an accommodating space. The receiver assembly is received in the accommodating space. The receiver assembly includes a receiver, a circuit board, and a conducting member. The conducting member is electrically connected to the receiver and the circuit board. The second housing is connected to the first housing and the conducting member.

7 Claims, 8 Drawing Sheets

ELECTRONIC DEVICE WITH RECEIVER ASSEMBLY

FIELD

The disclosure generally relates to an electronic device with a receiver assembly.

BACKGROUND

Receiver module in a mobile device is electrically connected to a main board through a wiring module. The wiring module includes a cable unit, a backing glue, and a reinforcing plate. The structure of the wiring module may be complicated. The manufacture and maintenance cost of the wiring module may be high.

BRIEF DESCRIPTION OF THE FIGURES

Implementations of the present disclosure will now be described, by way of example only, with reference to the attached figures.

DETAILED DESCRIPTION

Figure 1:
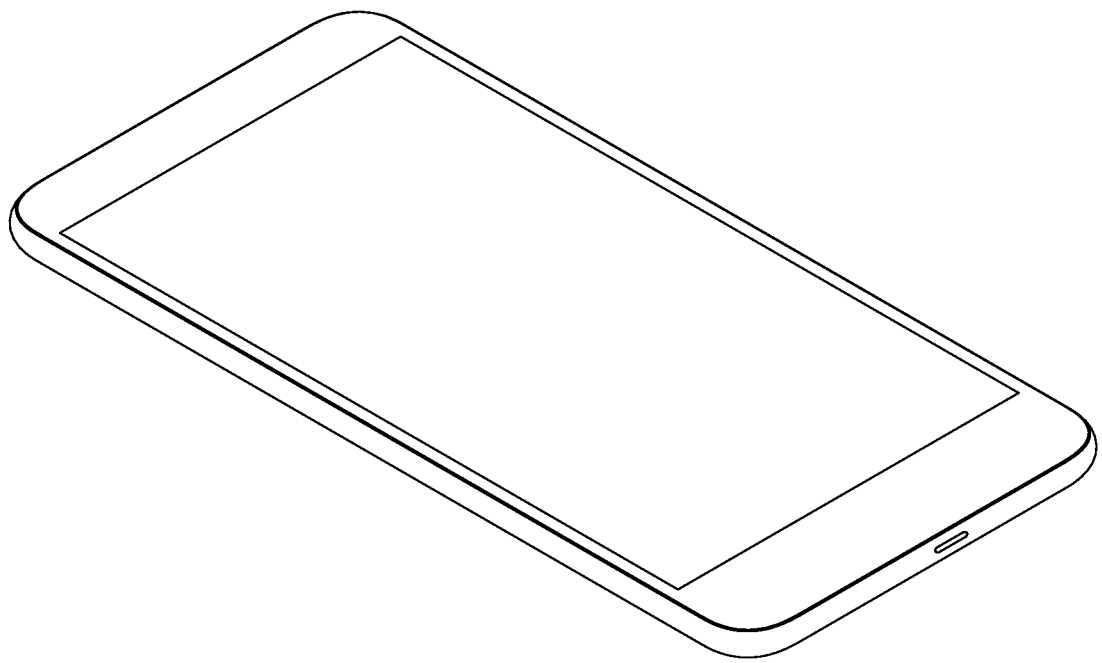
FIG. 1 is a perspective view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiment described herein can be practiced without these specific details. In other instances, methods, procedures, and components have not been described in detail so as not to obscure the related relevant feature being described. Further, the description is not to be considered as limiting the scope of the embodiments described herein. The drawings are not necessarily to scale and the proportions of certain parts may be exaggerated to better illustrate details and features of the present disclosure.

The term "comprising" when utilized, means "including, but is not limited thereto"; it specifically indicates open-ended inclusion or membership in the so-described combination, group, series and the like. The term "coupled" when utilized, means "a direct connection between the things that are connected, or an indirect connection through one or more passive or active intermediary devices, but is not limited thereto".

FIG. 1 illustrates an embodiment of an electronic device 100. The electronic device 100 may be, but is not limited to, a mobile phone (shown in FIG. 1), and a tablet computer. The mobile phone is not limited to structure shown in FIG. 1.

Figure 2:
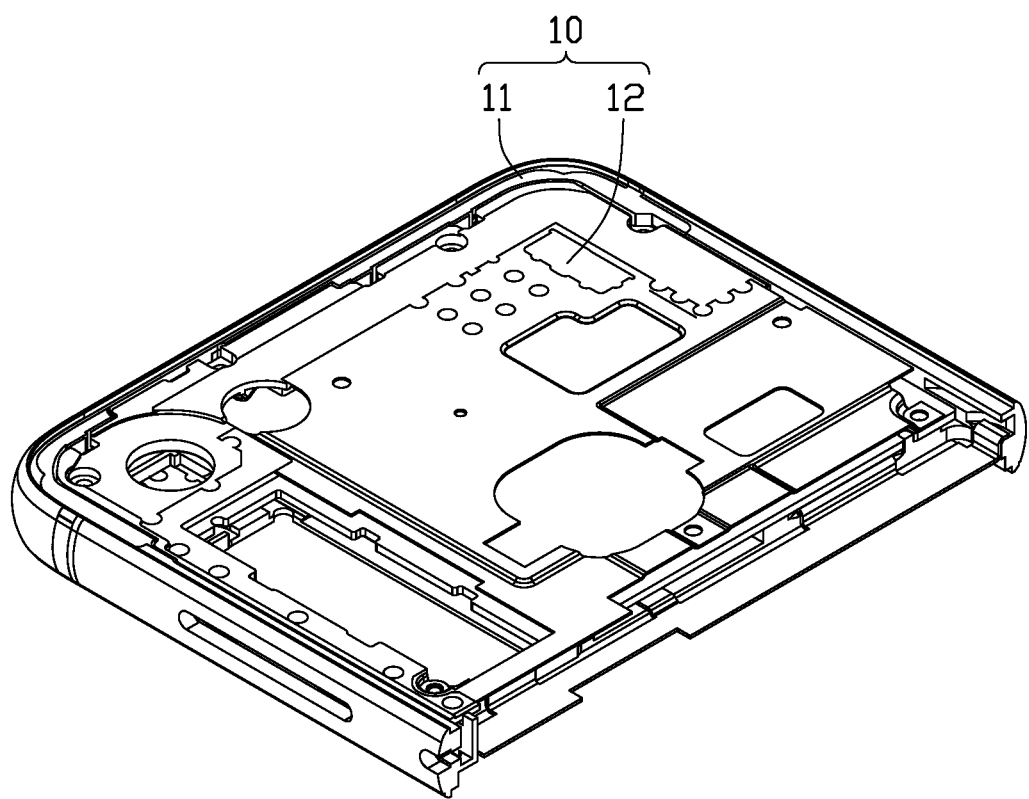
FIG. 2 is a perspective view of part of the electronic device in FIG. 1
Figure 3:
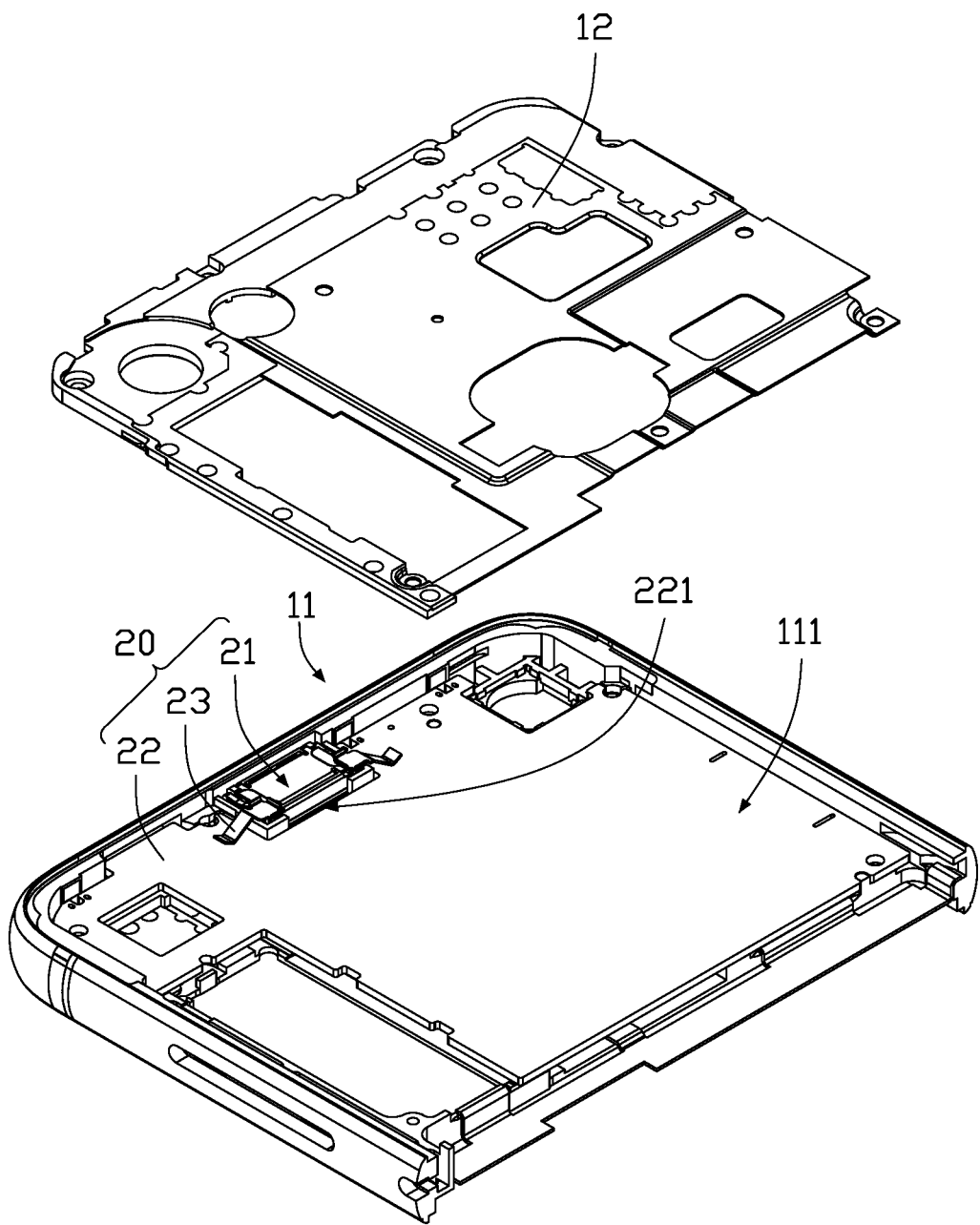
FIG. 3 is an exploded view of the electronic device in FIG. 2.

Referring to FIGS. 2 and 3, the electronic device 100 includes a housing assembly 10 and a receiver assembly 20. The housing assembly 10 includes a first housing 11 and a second housing 12. The first housing 11 defines an accommodating space 111. The receiver assembly 20 is received in the accommodating space 111. The receiver assembly 20 includes a receiver 21, a circuit board 22 and a conducting member 23. The conducting member 23 is electrically connected to the receiver 21 and the circuit board 22. The second housing 12 is connected to the first housing 11 and the conducting member 23. In one embodiment, the second housing 12 and the conducting member 23 are electrically insulated from each other.

In at least one embodiment, signal conduction between the receiver 21 and the circuit board 22 is realized by the conducting member 23. Compared with the wiring module in prior art, the conducting member 23 has a simple structure, which greatly reduces assembly and maintenance costs. In addition, through the connection of the second housing 12 and the conducting member 23, not only fixes the conducting member 23, but the electrical connection between the conducting member 23 and the receiver 21 and the circuit board 22 is assured and rendered reliable, thereby the yield rate of the receiver assembly 20 in manufacturing is greatly improved.

Figure 4:
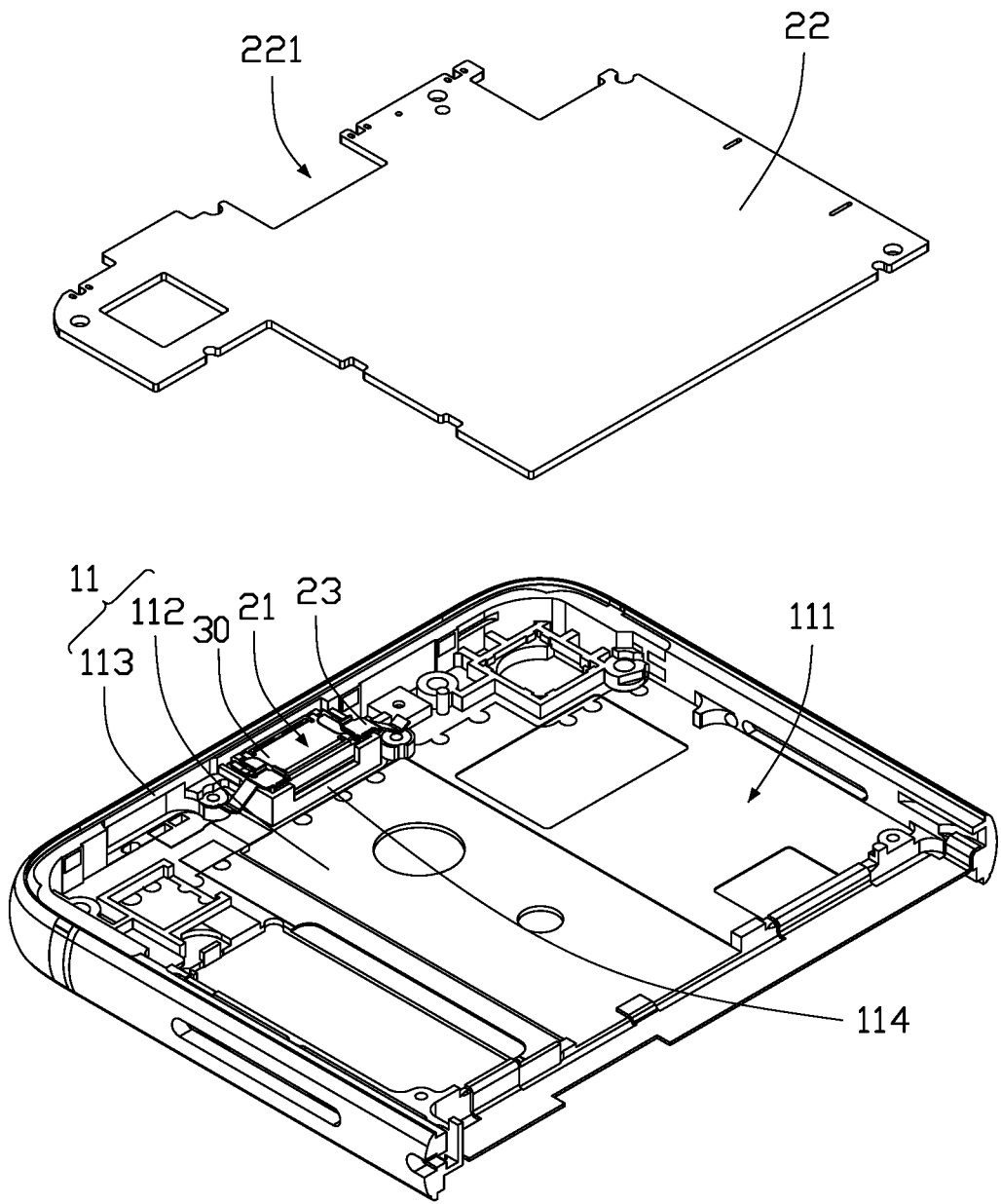
FIG. 4 is an exploded view of part of the electronic device in FIG. 3.

Referring to FIGS. 2 and 4, in at least one embodiment, the first housing 11 includes a first bottom plate 112 and a first side plate 113. The first side plate 113 protrudes from an edge of the first bottom plate 112. The first side plate 113 and the first bottom plate 112 cooperatively form the accommodating space 111. The second housing 12 is connected to a side of the first side plate 113 away from the bottom plate 112. The receiver 21 and the circuit board 22 are disposed on the first bottom plate 112.

The first housing 11 is made of metal, plastic, or a composite material. The composite material includes the metal and the plastic. The metal may be selected from one or more of steel alloy, aluminum alloy, iron alloy, copper alloy, nickel alloy, and stainless steel. The plastic may be selected from one or more of polystyrene (PS), polypropylene (PP), polyethylene (PE), polyester (PET), polyvinyl chloride (PVC), polyimide (PI), acrylonitrile-butadiene-styrene plastic (ABS), polycarbonate (PC) and polyamide (PA).

Figure 5:
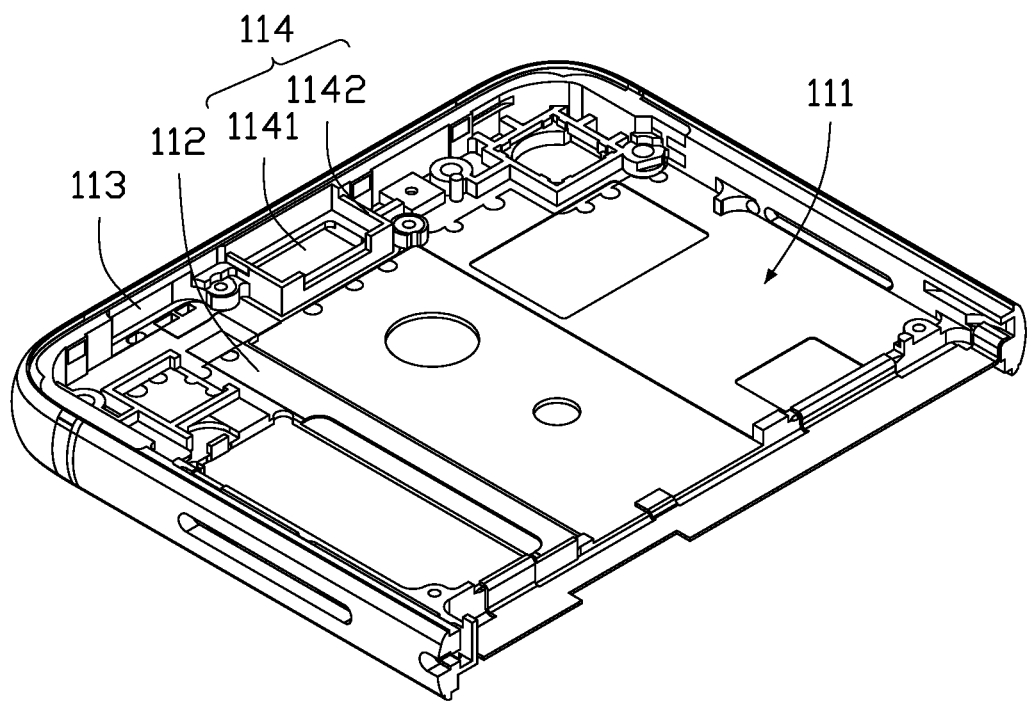
FIG. 5 is a perspective view of a first housing of the electronic device in FIG. 1.

Referring to FIGS. 4 and 5, the first bottom plate 112 further defines a receiving groove 114. The receiver 21 is received in the receiving groove 114. The receiving groove 114 includes a second bottom plate 1141 and a second side plate 1142. In at least one embodiment, the second bottom plate 1141 is a portion of the first bottom plate 112. In other embodiments, a portion of the first bottom plate 112 is recessed downward to form the second bottom plate 1141, or the portion of the first bottom plate 112 protrudes upward to form the second bottom plate 114. The second side plate 1142 surrounds a periphery of the second bottom plate 1141 to form the receiving groove 114.

Referring to FIG. 5, in at least one embodiment, the second side plate 1142 is connected to a portion of the first side plate 113, and the second side plate 1142 and the portion of the first side plate 113 surround the periphery of the second bottom plate 1141 to form the receiving groove 114. In other embodiments, the second side plate 1142 is not connected to the first side plate 113. That is, the second side plate 1142 is disposed around the periphery of the second bottom plate 1141 to form the receiving groove 114.

Referring to FIGS. 3 and 4, the circuit board 22 defines a notch 221 which profile matches the receiving groove 114. When the circuit board 22 is disposed on the first bottom plate 112, the receiving groove 114 is in the notch 221. In this way, one end of the conducting member 23 may be connected to the receiver 21, and the other end of the conducting member 23 may be connected to the circuit board 22.

In one embodiment, the receiver 21 includes terminals (not shown), and the circuit board 22 includes terminals (not shown), so that the conducting member 23 can be connected to the terminal of the receiver 21 and the terminal of the circuit board 22 to conduct signals between the receiver 21 and the circuit board 22. The terminals may be, but are not limited to pads, connectors, and connecting fingers.

Referring to FIG. 3, in at least one embodiment, the receiver assembly 20 includes two conducting members 23. The number of conducting members 23 may be adjusted according to needs. In other embodiments, the receiver assembly 20 may include three or four conducting members 23.

Figure 6:
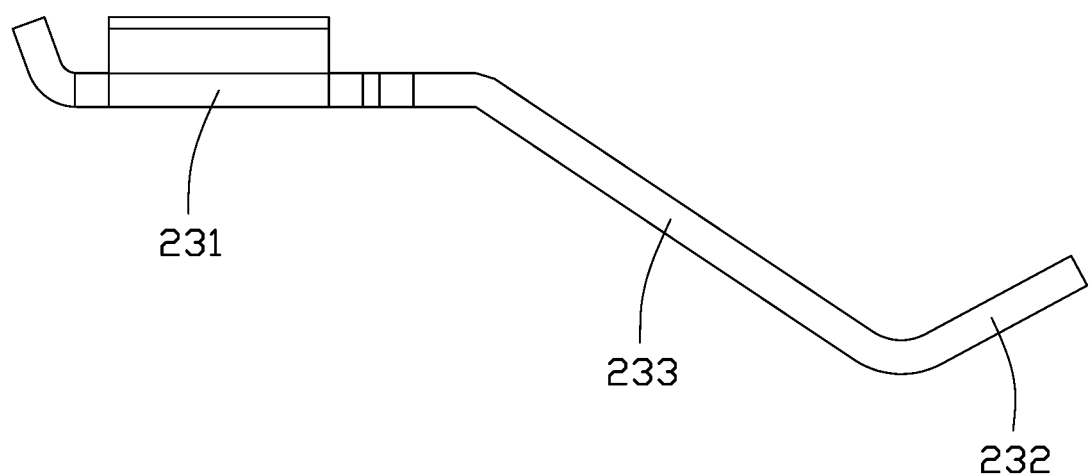
FIG. 6 is a side view of a conducting member of the electronic device in FIG. 3.

Referring to FIGS. 3 and 6, each conducting member 23 includes a first conducting plate 231, a second conducting plate 232, and a connecting plate 233. The connecting plate 233 is connected between the first conducting plate 231 and the second conducting plate 231. The first conducting plate 231 is electrically connected to the receiver 21. The second conducting plate 232 is electrically connected to the circuit board 22. In at least one embodiment, the first conducting plate 231 is disposed on a surface of the receiver 21 facing away from the first bottom plate 112. The second conducting plate 232 is disposed on a surface of the circuit board 22 facing away from the first bottom plate 112.

Figure 7:
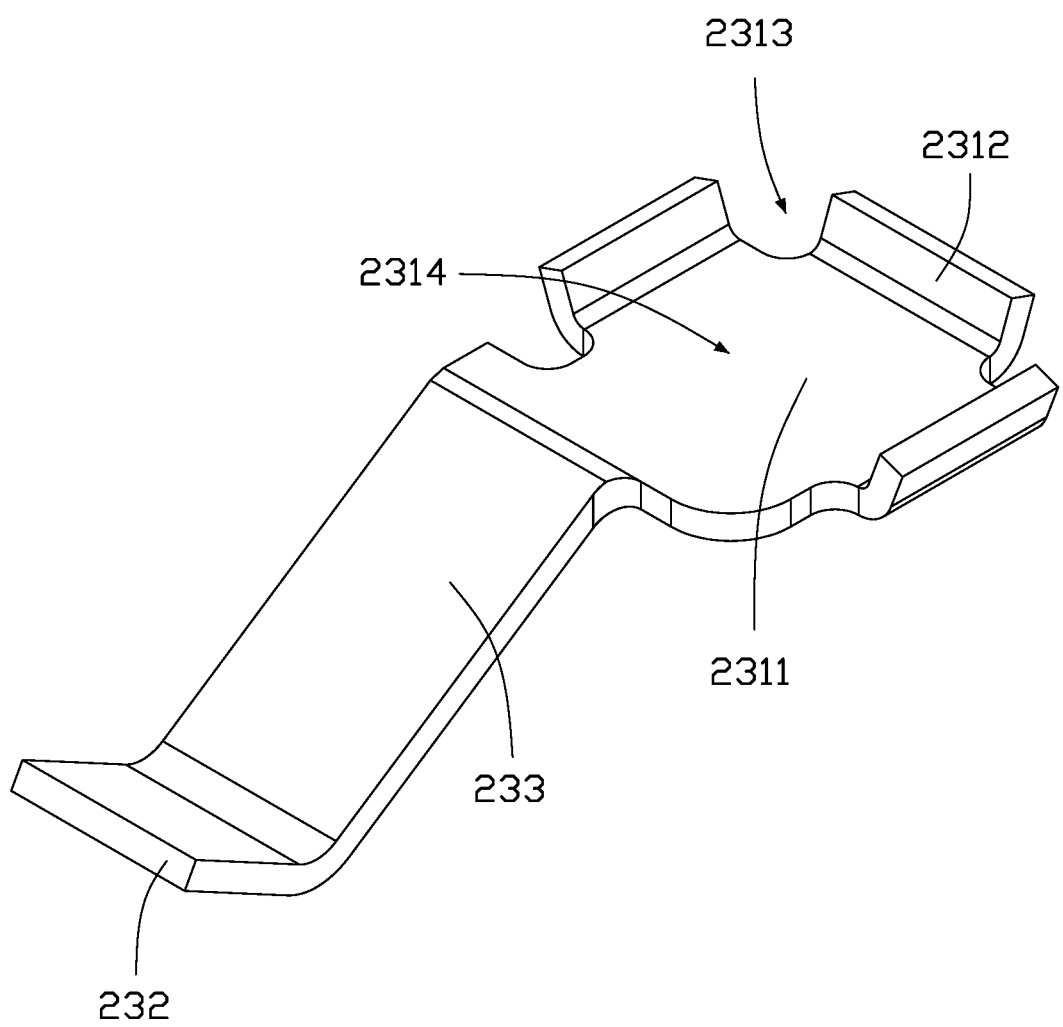
FIG. 7 is a perspective view of a conducting member of the electronic device in FIG. 3.
Figure 8:
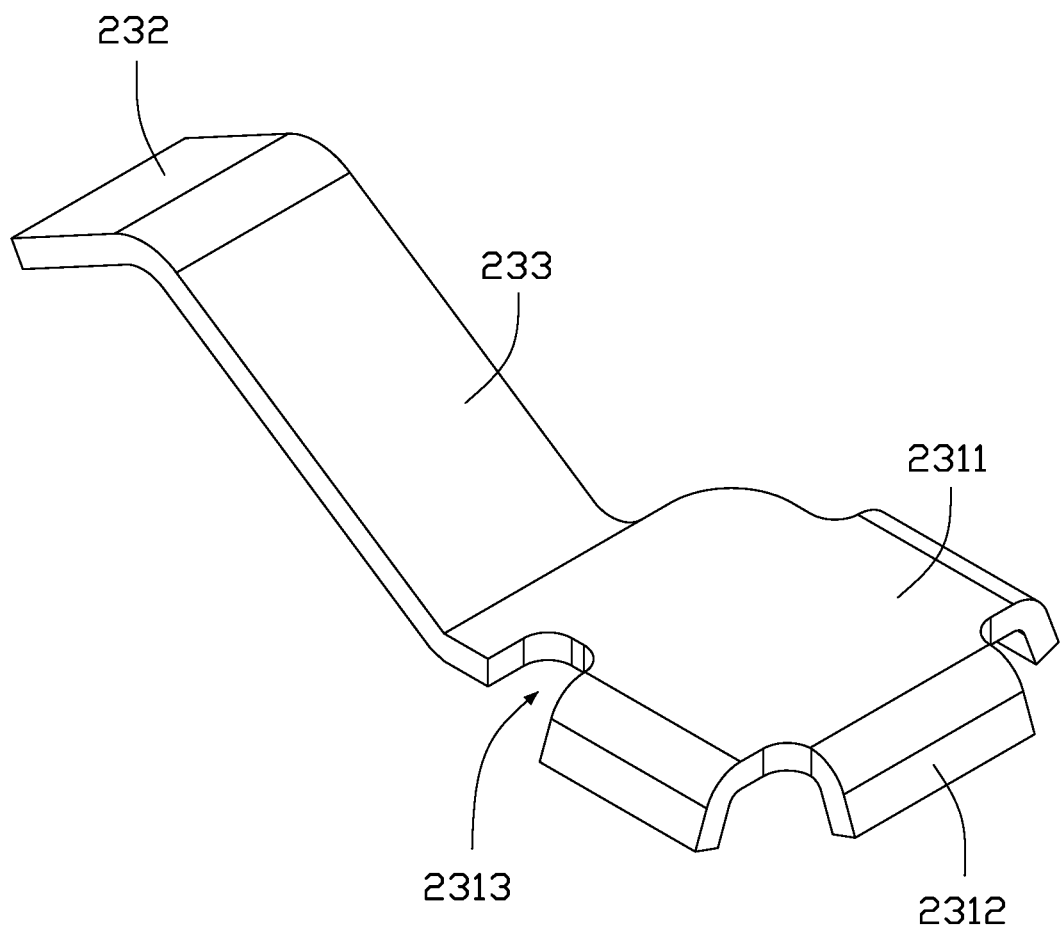
FIG. 8 is a view from another angle of the conducting member in FIG. 7.

Referring to FIGS. 7 and 8, the first conducting plate 231 includes a main plate 2311 and a plurality of extending plates 2312. The main plate 2311 is connected to the connecting plate 233. The extending plates 2312 are connected to an edge of the main plate 2311. In at least one embodiment, the main plate 2311 is disposed on the surface of the receiver 21 facing away from the first bottom plate 112.

In at least one embodiment, the extending plate 2312 and the main plate 2311 are both rectangular. In other embodiments, the shapes of the extending plate 2312 and the main plate 2311 may be, but are not limited to circular or rhomboid.

Referring to FIGS. 7 and 8, the edge of the main plate 2311 extends outward to form the extending plates 2312. The extending plates 2312 are bent relative to the main plate 2311 in a direction away from the receiver 21, and the extending plates 2312 and the main plate 2311 cooperatively form a receiving space 2314. In at least one embodiment, the first conducting plate 231 includes three extending plates 2312. In other embodiments, the number of extending plates 2312 may be adjusted depending on the size and the shape of the main plate 2311. The first conducting plate 231 can include two, four, or five extending plates 2312.

Referring to FIGS. 7 and 8, the extending plates 2312 are spaced from each other. In this way, gaps 2313 are formed between adjacent extending plates 2312 and between the connecting plate 233 and the extending plate 2312 adjacent to the connecting plate 233. A portion of the second housing 12 is disposed in the receiving space 2314 and the gap 2313 to fix the conducting member 23 in place, so as to ensure that the conducting member 23 is electrically connected to the receiver 21 and the circuit board 22.

The extending plats 2312 strengthen the connection between the second housing 12 and the conducting member 23, and prevent the conducting member 23 moving away.

In one embodiment, the second housing 12 is not limited to being formed by injection molding process. A material of the second housing 12 is not limited to being polystyrene (PS), polypropylene (PP), polyethylene (PE), polyester (PET), polyvinyl chloride (PVC), polyimide (PI), acrylic, nitrile butadiene styrene (ABS), polycarbonate (PC), and polyamide (PA).

Referring to FIGS. 3, 6 and 7, the height difference between the receiver 21 and the circuit board 22 inclines the connecting plate 233 toward the circuit board 22 relative to the main plate 2311. The connecting plate 233 is flat.

Referring to FIGS. 3, 6, 7 and 8, the second conducting plate 232 is connected to an end of the connecting plate 233 away from the first conducting plate 231, and is bent relative to the circuit board 22 toward the connecting plate 233. A connection between the connecting plate 233 and the second conducting plate 232 is electrically connected to the circuit board 22.

In at least one embodiment, the conducting member 23 is integrally formed. In other embodiments, the first conducting plate 231, the second conducting plate 232, and the connecting plate 233 may be joined by soldering to form the conducting member 23.

In at least one embodiment, referring to FIGS. 3 and 4, the electronic device 100 further includes a protective layer 30. The protective layer 30 is disposed on an outer surface of the conducting member 23. The protective layer 30 gives durability to the conducting member 23 and reinforces the electrical connection between the receiver 21 and the circuit board 22. In one embodiment, the protective layer 30 is made of gold. The protective layer 30 may be formed on the outer surface of the conducting member 23 by an electroplating process.

Referring to FIGS. 2 to 8, steps for assembly of the electronic device 100 are as follows:

At first step, the first housing 11 is provided.

At second step, the receiver 21 is placed into the receiving groove 114, and the circuit board 22 is put onto the first bottom plate 112. The receiving groove 114 is in the notch 221 of the circuit board 22.

At third step, the two conducting members 23 are electrically connected to the receiver 21 and the circuit board 22.

At fourth step, the first housing 11 for the receiver assembly 12 is placed in a mold (not shown), and resin is injected into the mold to form the second housing 12 connected to the first housing 11. The resin is injected into the receiving space 2314 and the gap 2313 at the same time, so that the second housing 12 is connected to the first conducting plate 231, and thereby the conducting member 23 is fixed in place.

It is to be understood, however, that even through numerous characteristics and advantages of the present disclosure have been set forth in the foregoing description, together with details of assembly and function, the disclosure is illustrative only, and changes may be made in details, especially in the matters of shape, size, and arrangement of parts within the principles of the disclosure to the full extent indicated by the broad general meaning of the terms in which the appended claims are expressed.

What is claimed is:

1. An electronic device, comprising:
  a housing assembly comprising:
    a first housing defining an accommodating space; and
    a second housing connected to the first housing; and a receiver assembly received in the accommodating space, the receiver assembly comprising:

a receiver;

a circuit board; and a conducting member, wherein the conducting member is electrically connected to each of the receiver and the circuit board, and the conducting member is connected to the second housing; the conducting member comprises a first conducting plate, a second conducting plate, and a connecting plate, the connecting plate is connected between the first conducting plate and the second conducting plate, the first conducting plate is electrically connected to each of the receiver and the second housing, and the second conducting plate is electrically connected to the circuit board; the first conducting plate comprises a main plate and a plurality of extending plates, the main plate is connected to the connecting plate, an edge of the main plate extends outward to form the plurality of extending plates, each of the plurality of extending plates is bent relative to the main plate in a direction away from the receiver, and the plurality of extending plates and the main plate cooperatively form a receiving space; the plurality of extending plates are spaced from each other, gaps are formed between two adjacent extending plates and between the connecting plate and the extending plate adjacent to the connecting plate, a portion of the second housing is disposed in the receiving space and the gaps and connects the first conducting plate.

2. The electronic device of claim 1, wherein the second conducting plate is connected to an end of the connecting plate away from the first conducting plate, and is bent relative to the circuit board toward the connecting plate, a connection between the connecting plate and the second conducting plate is electrically connected to the circuit board.

3. The electronic device of claim 1, wherein the electronic device comprises a protective layer, and the protective layer disposed on an outer surface of the conducting member.

4. The electronic device of claim 1, wherein the first housing further comprises a first bottom plate and a first side plate opposite to the first bottom plate, the first side plate protrudes from an edge of the first bottom plate, the first side plate and the first bottom plate cooperatively form the accommodating space, and the receiver and the circuit board are on the first bottom plate.

5. The electronic device of claim 4, wherein the first bottom plate defines a receiving groove, the receiver is received in the receiving groove, the receiving groove comprises a second bottom plate and a second side plate, the second bottom plate is on the first bottom plate, and the second side plate surrounds a periphery of the second bottom plate to form the receiving groove.

6. The electronic device of claim 5, wherein the circuit board defines a notch which profile matches the receiving groove, and the receiving groove is disposed in the notch.

7. The electronic device of claim 1, wherein the second housing is formed by injection molding process.

* * * * *